United States Patent
Hsu

(10) Patent No.: US 10,096,277 B2
(45) Date of Patent: Oct. 9, 2018

(54) OLED DISPLAY DEVICE AND PIXEL REPAIR METHOD THEREOF

(71) Applicant: BOE Technology Group Co., Ltd., Beijing (CN)

(72) Inventor: Minghung Hsu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/344,142

(22) Filed: Nov. 4, 2016

(65) Prior Publication Data
US 2017/0213496 A1  Jul. 27, 2017

(30) Foreign Application Priority Data

Jan. 22, 2016 (CN) .................. 2016 1 10046820

(51) Int. Cl.
G09G 5/02 (2006.01)
G09G 3/20 (2006.01)
H01L 27/32 (2006.01)
G09G 3/3225 (2016.01)

(52) U.S. Cl.
CPC ......... *G09G 3/2074* (2013.01); *G09G 3/3225* (2013.01); *H01L 27/322* (2013.01); *H01L 27/3213* (2013.01); *H01L 27/3216* (2013.01); *H01L 27/3218* (2013.01); *G09G 2300/0443* (2013.01); *G09G 2300/0452* (2013.01); *G09G 2320/0242* (2013.01); *G09G 2330/10* (2013.01); *H01L 2251/568* (2013.01)

(58) Field of Classification Search
CPC .................................................. G09G 3/2074
USPC ........................................................ 345/697
See application file for complete search history.

(56) References Cited

U.S. PATENT DOCUMENTS 5,642,176 A * 6/1997 Abukawa .......... G02F 1/133514
                                                    349/106
2005/0121669 A1* 6/2005 Kobayashi ............ H01L 27/322
                                                    257/40
2010/0060148 A1* 3/2010 Hwang ............... H01L 27/3213
                                                    313/504

(Continued)

FOREIGN PATENT DOCUMENTS

CN         104835830 A        8/2015

OTHER PUBLICATIONS

Feb. 11, 2018—(CN) First Office Action Appn 201610046820.3 with English Tran.

*Primary Examiner* — Long D Pham
(74) *Attorney, Agent, or Firm* — Banner & Witcoff, Ltd.

(57) ABSTRACT

An OLED display device and a repair method thereof are disclosed. The OLED display device includes a pixel, wherein the pixel includes a red sub-pixel, a green sub-pixel, a blue sub-pixel and a white sub-pixel; the red sub-pixel includes a first OLED device and a first red filter located on a light outgoing side of the first OLED device; the green sub-pixel includes a second OLED device and a first green filter located on a light outgoing side of the second OLED device; the blue sub-pixel includes a third OLED device and a first blue filter located on a light outgoing side of the third OLED device; and the white sub-pixel includes a fourth OLED device and a second red filter, a second green filter and a second blue filter located on a light outgoing side of the fourth OLED device.

20 Claims, 4 Drawing Sheets

(56) References Cited

U.S. PATENT DOCUMENTS

2014/0313110 A1* 10/2014 Ito .................. G09G 3/3233
345/77

* cited by examiner

OLED DISPLAY DEVICE AND PIXEL REPAIR METHOD THEREOF

This application claims priority to and the benefit of Chinese Patent Application No. 201610046820.3 filed on Jan. 22, 2016, which application is incorporated herein in its entirety.

TECHNICAL FIELD

Embodiments of the present disclosure relate to an OLED display device and a pixel repair method thereof.

BACKGROUND

Because of characteristics of high efficiency and capability of being applied to a display without a fine metal mask (FMM) or other complex patterning processes, and advantages of being prepared on a large scale easily and achieving full-color display and the like, a tandem white Organic Light-Emitting Diode (OLED) has wide application prospects and has received wide attention, and is especially applicable to large-sized display. However, because an active driving pixel circuit is complex, a thickness of an OLED device is small, and lots of dust generation sources exist in a manufacturing process, lots of defects are likely to happen in a manufacturing process of the display, and therefore a final production yield is reduced. In an existing spot defect repair method, TFT connection lines are cut off mostly through laser, and a driver does not work, to form dark spots less affecting display quality, but too many dark spots still affect a display effect and reduce a product rating.

SUMMARY

An embodiment of the present disclosure provides an OLED display device, including a pixel, wherein the pixel includes a red sub-pixel, a green sub-pixel, a blue sub-pixel and a white sub-pixel; the red sub-pixel includes a first OLED device and a first red filter located on a light outgoing side of the first OLED device; the green sub-pixel includes a second OLED device and a first green filter located on a light outgoing side of the second OLED device; the blue sub-pixel includes a third OLED device and a first blue filter located on a light outgoing side of the third OLED device; and the white sub-pixel includes a fourth OLED device and a second red filter, a second green filter and a second blue filter located on a light outgoing side of the fourth OLED device.

Another embodiment of the present disclosure provides a repair method of the OLED display device according to claim 1, including: in a case that one of the red sub-pixel, the green sub-pixel and the blue sub-pixel has a bright spot defect, making the one of the red sub-pixel, the green sub-pixel and the blue sub-pixel failing to emitting light to become a dark spot; irradiating a region of the white sub-pixel except the light filter with a same color as that of the one of the red sub-pixel, the green sub-pixel and the blue sub-pixel to make an irradiated region of the fourth OLED device deteriorate and not emit light anymore; when displaying, during gray scale converting from RGB into RGBW, a gray scale of the one sub-pixel is multiplied by a preset coefficient according to a size of the light filter of the white sub-pixel with the same color as that of the one of the red sub-pixel, the green sub-pixel and the blue sub-pixel, and then written into a gray scale of the white sub-pixel, and gray scales of the others of the red sub-pixel, the green sub-pixel and the blue sub-pixel being not converted.

BRIEF DESCRIPTION OF THE DRAWINGS

In order to clearly illustrate the technical solution of the embodiments of the disclosure, the drawings needing to be used in the embodiments or relevant technical description will be briefly described in the following; it is obvious that the described drawings are only related to some embodiments of the disclosure and thus are not limitative of the disclosure.

DETAILED DESCRIPTION

Figure 1:
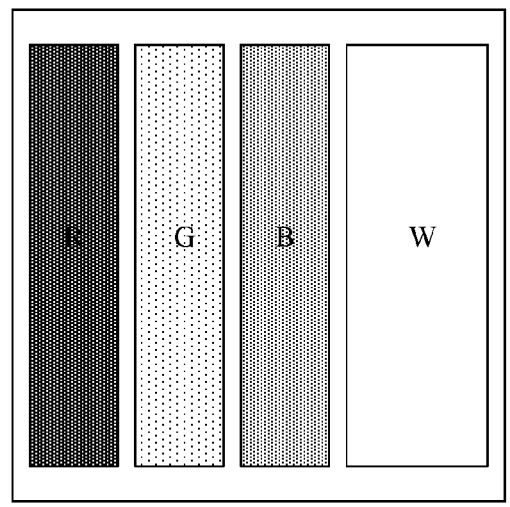
FIG. 1 is a plane structural schematic diagram of an OLED display device (one pixel) in a related art.
Figure 2:
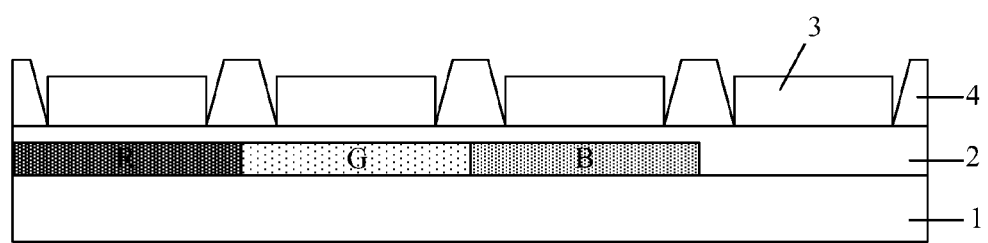
FIG. 2 is a cross section schematic diagram of the OLED display device (one pixel) of FIG. 1.

As shown in FIG. 1, in a related White OLED+Color Filter (WOLED+CF) framework, independent color filters R, G, B, and W are formed below white organic diode devices 3 respectively, and the color filters do not overlap with each other. A cross section of the OLED display device is as shown in FIG. 2; corresponding to positions of the red, green and blue sub-pixels, the filter R (red filter), the filter G (green filter) and the filter B (blue filter) are formed above a base substrate 1; and no color filter is provided on a position of a W (white) pixel. A transparent organic passivation layer 2 covers the three filters, and a spacer 4 is located on the organic passivation layer 2. In each of the sub-pixels, a white OLED 3 above the organic passivation layer 2 generates light of different colors after passing through the corresponding color filter to form red, green, blue or white sub-pixel, wherein the transparent organic passivation layer 2 is below a white sub-pixel and thus guarantees that the pixel emit white light. Considerable power consumption can be saved under most of white pictures. In the related configuration, when a certain white sub-pixel cannot be lightened, the red, green and blue sub-pixels within the same pixel can be used for replacing the white sub-pixel for display, based on a three-primary color principle of colors. A specific workflow is as follows: a coordinate position where a spot defect of a white picture (only limited to the white sub-pixel) is inspected by using Automatic Optic Inspection (AOI), if the spot defect is a bright spot, connection between a thin film transistor (TFT) and the white sub-pixel is cut off by laser, to make the bright spot become a dark spot. The coordinate position of the white sub-pixel is fed back to a timing control circuit to be recorded, a spot recording the coordinate position is directly written at an original RGB gray scale without conversion in a process of converting the RGB gray scale into RGBW, in this way, the dark spot of the white sub-pixel can still perform normal display through three colors of RGB sub-pixels. However, the method is only limited to a case that the defect occurs in the white sub-pixel. According to the three-primary color principle of colors, when a bright spot defect generated in any of the red, green, and blue sub-pixels, the other sub-pixel within the same pixel cannot be used for replacement, and the defect becomes a display defect.

The technical solutions of the embodiments of the present disclosure will be described in a clearly and fully understandable way in connection with the drawings. It is obvious that the described embodiments are just a part but not all of the embodiments of the present disclosure. Based on the embodiments in the present disclosure, those skilled in the art can obtain other embodiment(s), without any inventive work, which should be within the scope of the present disclosure.

Figure 3:
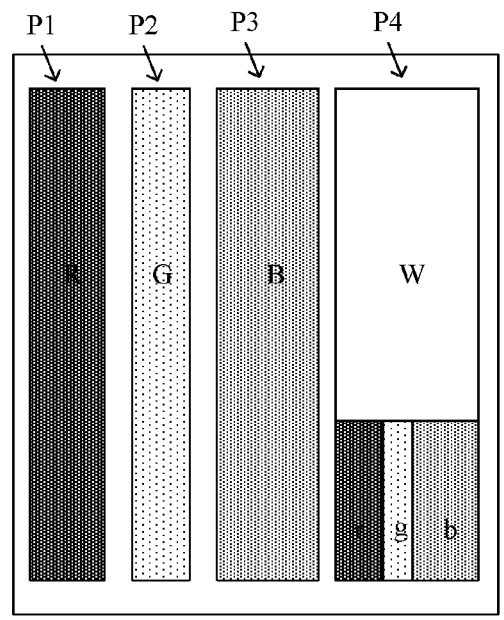
FIG. 3 is a plane structural schematic diagram of a first OLED display device (one pixel) of an embodiment of the present disclosure.
Figure 4:
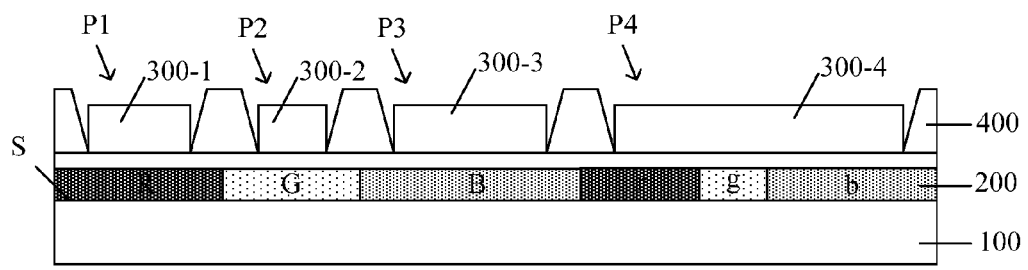
FIG. 4 is a cross section schematic diagram of the OLED display device (one pixel) of FIG. 3.

An OLED display device provided by an embodiment includes a pixel array formed by a plurality of pixels, and as shown in FIG. 3 and FIG. 4, each pixel includes a red sub-pixel P1, a green sub-pixel P2, a blue sub-pixel P3 and a white sub-pixel P4. Corresponding OLED devices 300-1, 300-2, 300-3 and 300-4 are respectively formed in the red sub-pixel P1, the green sub-pixel P2, the blue sub-pixel P3 and the white sub-pixel P4. In the red sub-pixel P1, the green sub-pixel P2 and the blue sub-pixel P3, a first red filter R, a first green filter G and a first blue filter B are respectively formed on light outgoing sides of the respective OLED devices. That is, in the red sub-pixel P1, light emitted from the OLED device 300-1 passes through the first red filter R; in the green sub-pixel P2, light emitted from the OLED device 300-2 passes through the first green filter G; in the blue sub-pixel P3; light emitted from the OLED device 300-3 passes through the first blue filter B. In the white sub-pixel P4, a second red filter r, a second green filter g and a second blue filter b are formed on a light outgoing side of the OLED device 300-4. That is, in the white sub-pixel P4, a part of light emitted from the OLED device 300-4 passes through the second red filter r, the second green filter g and the second blue filter b, and the other part of the light does not pass through any light filter and is emitted from the white sub-pixel P4 as white light. Herein, the OLED devices 300-1, 300-2, 300-3 and 300-4 are all configured to emit white light, and thus are white OLEDS. For example, the first red filter R, the first green filter G and the first blue filter B are formed above the base substrate 100, color filters including the second red filter r, the second green filter g and the second blue filter b are correspondingly formed above the base substrate 100 at the position of the while sub-pixel P4. A transparent organic passivation layer 200 covers all the color filters, and a spacer 400 is located on the organic passivation layer 200. Plane ranges of the red sub-pixel P1, the green sub-pixel P2, the blue sub-pixel P3 and the white sub-pixel P4 are defined by the spacer 400. In the embodiment, a vertical projection of the OLED device 300-1 of the red sub-pixel P1 is located within a vertical projection of the first red filter R on an upper surface S of the base substrate 100; a vertical projection of the OLED device 300-2 of the green sub-pixel P2 is located within a vertical projection of the first green filter G on the upper surface S of the base substrate 100; a vertical projection of the OLED device 300-3 of the blue sub-pixel P3 is located within a vertical projection of the first blue filter B on the upper surface S of the base substrate 100; a vertical projection of the OLED device 300-4 of the white sub-pixel P4 on the upper surface S of the base substrate 100 partially overlaps with vertical projections of the second red filter r, the second green filter g and the second blue filter b on the upper surface S of the base substrate 100.

According to the OLED display device in the embodiment, by arranging the red, green and blue color filters (namely, the second red filter r, the second green filter g and the second blue filter b) in the region of the white sub-pixel, when a defect happens to any one of the red sub-pixel P1, the green sub-pixel P2 and the blue sub-pixel P3, the other three sub-pixels can be used for restoration and compensation, and quality of normal display is maintained. In addition, by providing the second red filter r, the second green filter g and the second blue filter b of different sizes or different arrangement manners (sizes of the first red filter R, the first green filter G and the first blue filter B can be same or can also be different), so that color matching can be performed and the white sub-pixel P4 can directly display correct color temperature.

In the embodiment, as shown in FIG. 3, plane sizes of the red sub-pixel P1, the green sub-pixel P2 and the blue sub-pixel P3 are different. Plane sizes of the second red filter r, the second green filter g and the second blue filter b in the white sub-pixel P4 are scaled down at equal proportion with respect to the plane sizes of the red sub-pixel P1, the green sub-pixel P2 and the blue sub-pixel P3, respectively. That is, a ratio of the plane size of the red sub-pixel P1 to the plane size of the second red filter r in the white sub-pixel P4 is equal to a ratio of the plane size of the green sub-pixel P2 to the plane size of the second green filter g in the white sub-pixel P4, and equal to a ratio of the plane size of the blue sub-pixel P3 to the plane size of the second blue filter b in the white sub-pixel P4. In a region of the white sub-pixel P4 other than the region where the second red filter r, the second green filter g, and the second blue filter b located, no color filter is provided.

In the embodiment, for example, the plane sizes of the red sub-pixel P1, the green sub-pixel P2 and the blue sub-pixel P3 are equal to plane sizes of the OLED devices 300-1, 300-2, 300-3 and 300-4 respectively.

Figure 5:
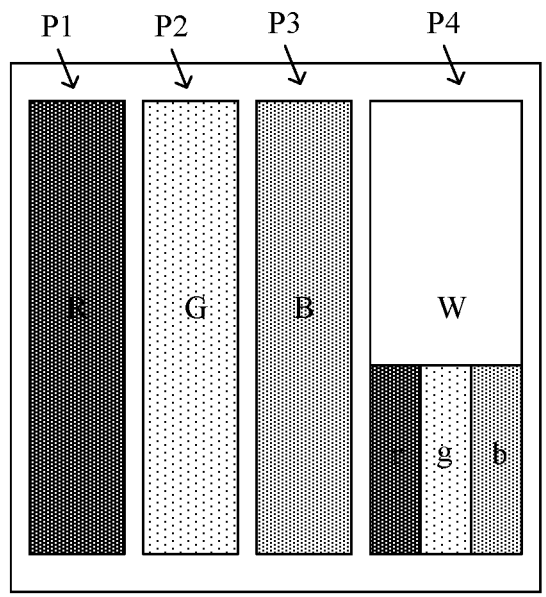
FIG. 5 is a plane structural schematic diagram of a second OLED display device (one pixel) of an embodiment of the present disclosure.

In another example, as shown in FIG. 5, plane sizes of a red sub-pixel P1, a green sub-pixel P2 and a blue sub-pixel P3 are the same. Plane sizes of a second red filter r, a second green filter g and a second blue filter b in a white sub-pixel P4 are the same and smaller than the plane sizes of the red sub-pixel P1, the green sub-pixel P2 and the blue sub-pixel P3.

In a further example, plane sizes of a second red filter r, a second green filter g and a second blue filter b in a white sub-pixel P4 can also be different. As show in FIG. 6, the second red filter r, the second green filter g and the second blue filter b in the white sub-pixel P4 are each, for example, in a rectangular shape. In the white sub-pixel P4, a plane size of the second red filter r is equal to a plane size of the second green filter g and smaller than a plane size of the second blue filter b. In the white sub-pixel P4, the second red filter r, the second green filter g and the second blue filter b are arranged in a triangular manner. For example, a plane center of the second red filter r, a plane center of the second green filter g and a plane center of the second blue filter b form three vertexes of a regular triangle.

Figure 7:
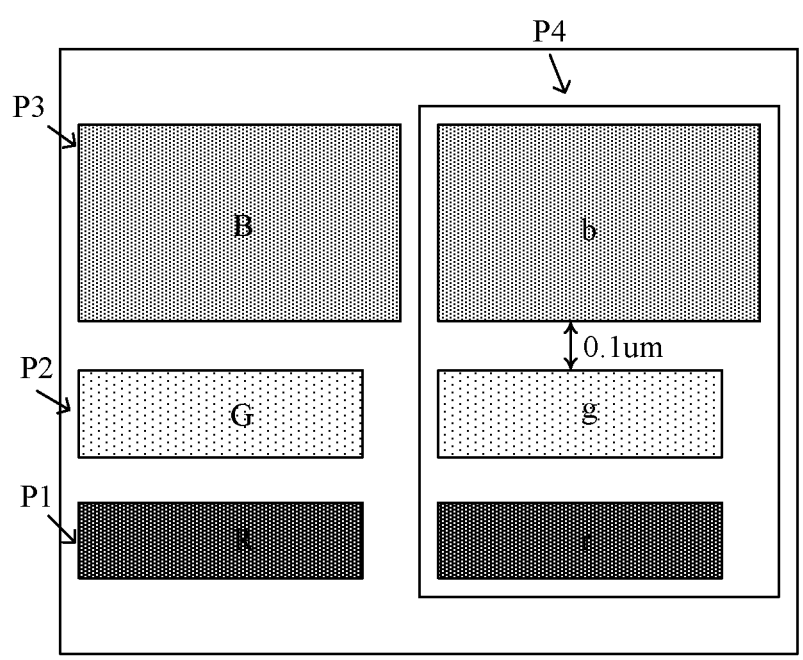
FIG. 7 is a plane structural schematic diagram of a fourth OLED display device (one pixel) of an embodiment of the present disclosure.

In a further example, as shown in FIG. 7, plane sizes of a second red filter r, a second green filter g and a second blue filter b in a white sub-pixel P4 are respectively the same as plane sizes of a red sub-pixel P1, a green sub-pixel P2 and a blue sub-pixel P3. A plane size of the whole white sub-pixel is greater than a sum of the plane sizes of the red sub-pixel P1, the green sub-pixel P2 and the blue sub-pixel P3.

In the embodiment, an arrangement manner of the second red filter r, the second green filter g and the second blue filter b can be consistent with that of the first red filter R, the first green filter G and the first blue filter B.

In order not to affect an aperture ratio of the display device, an interval of 0.1 um or above is provided between every two adjacent light filters in the second red filter r, the second green filter g and the second blue filter b in the white sub-pixel P4. An interval of 0.1 um or above between every two adjacent color filters of the red sub-pixel P1, the green sub-pixel P2 and the blue sub-pixel P3.

Figure 6:
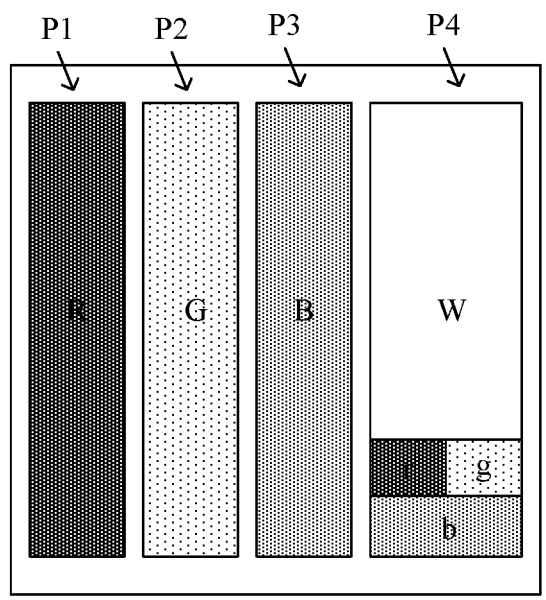
FIG. 6 is a plane structural schematic diagram of a third OLED display device (one pixel) of an embodiment of the present disclosure.

In the region of the white sub-pixel P4, the second red filter r, the second green filter g and the second blue filter b can be arranged in various manners, can be arranged in a linear manner or in a triangular manner in FIG. 6, and can also be arranged in other arrangement manner. The plane sizes and the arrangement manners of the second red filter r, the second green filter g and the second blue filter b in the white sub-pixel P4 are related to color temperature of the whole display device and a service life difference caused by a use ratio of various colors.

As shown in FIG. 7, the plane sizes of the second red filter r, the second green filter g and the second blue filter b in the white sub-pixel P4 are respectively the same as the plane sizes of the red sub-pixel P1, the green sub-pixel P2 and the blue sub-pixel P3. The plane size of the whole white sub-pixel P4 is greater than the sum of the plane sizes of the red sub-pixel P1, the green sub-pixel P2 and the blue sub-pixel P3. Furthermore, the arrangement manner of the second red filter r, the second green filter g and the second blue filter b in the white sub-pixel P4 is consistent with that of the red sub-pixel P1, the green sub-pixel P2 and the blue sub-pixel P3. An interval of 0.1 um or above is reserved between every two adjacent light filters in the white sub-pixel P4. Because sizes of all the light filters are same, and arrangement manners of the light filters are same, color temperature of the white sub-pixel and color temperatures of the other three sub-pixels are more balanced; besides, the interval of 0.1 um or above is reserved between every two adjacent filters, and the aperture ratio is not affected.

An embodiment of the present disclosure further provides a repair method of an OLED display device based on the above, by which a bright spot defect on any of the white sub-pixel, the red sub-pixel, the green sub-pixel and the blue sub-pixel can be repaired.

The repair method includes:

detecting a coordinate of a bright spot defect, feeding the coordinate back to a timing control circuit to be recorded, and cutting off connection of an X sub-pixel corresponding to the bright spot and a TFT thereof by laser, so that the OLED device in this sub-pixel is not capable of emitting light. Therefore, the sub-pixel becomes a dark spot. the X sub-pixel being one of the red sub-pixel, the green sub-pixel and the blue sub-pixel. In the embodiment, the coordinate of the bright spot is detected through automatic optic inspection (AOI).

irradiating a region of the white sub-pixel of the pixel where the bright spot is located except the region where the color filter has the same color with the X sub-pixel is located with ultraviolet rays, to make an irradiated region of the OLED device of the white sub-pixel deteriorate and not emit light any more.

When displaying, as to the pixel where the bright spot defect is located, in a process of converting a RGB gray scale into RGBW, a gray scale of the X sub-pixel is multiplied by a preset coefficient according to the plane size of the light filter of the white sub-pixel with a color same as that of the X sub-pixel and then written into a gray scale of the white sub-pixel, and the rest gray scales being not converted.

In the embodiment, a gray scale conversion formula is as follows:

$$x\widehat{\ }gamma \times S1 = w\widehat{\ }gamma \times S2$$

Where, ^ denotes power operation, x is a size of a gray scale corresponding to the X sub-pixel in an original RGB signal, w is a size of a gray scale corresponding to the white sub-pixel in an converted RGBW signal, S1 is a plane size of the X sub-pixel, S2 is a plane size of the light filter of the white sub-pixel has the same color as the X sub-pixel, and gamma is a relationship parameter of a gray scale and brightness of the display device and ranges from 2 to 2.4.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of Chinese Patent Application No. 201610046820.3 filed on Jan. 22, 2016, the present disclosure of which is incorporated herein by reference in its entirety as part of the present application.

What is claimed is:

1. An Organic Light-Emitting Diode (OLED) display device, comprising a pixel, wherein the pixel includes a red sub-pixel, a green sub-pixel, a blue sub-pixel and a white sub-pixel; the red sub-pixel includes a first OLED device and a first red filter located on a light outgoing side of the first OLED device; the green sub-pixel includes a second OLED device and a first green filter located on a light outgoing side of the second OLED device; the blue sub-pixel includes a third OLED device and a first blue filter located on a light outgoing side of the third OLED device; and the white sub-pixel includes a fourth OLED device and a second red filter, a second green filter and a second blue filter located on a light outgoing side of the fourth OLED device, wherein, in a plan view of the OLED display device, a portion of the white sub-pixel, other than portions corresponding to the second red filter, the second green filter, and the second blue filter, is larger than a sum of areas of the second red filter, the second green filter, and the second blue filter.

2. The OLED display device according to claim 1, wherein, a ratio of a plane size of the red sub-pixel to a plane size of the second red filter of the white sub-pixel is equal to a ratio of a plane size of the green sub-pixel to a plane size of the second green filter of the white sub-pixel, and equal to a ratio of a plane size of the blue sub-pixel to a plane size of the second blue filter of the white sub-pixel.

3. The OLED display device according to claim 2, wherein, the ratio of the plane size of the red sub-pixel to the plane size of the second red filter of the white sub-pixel is equal to 1; the ratio of the plane size of the green sub-pixel to the plane size of the second green filter of the white sub-pixel is equal to 1; and the ratio of the plane size of the blue sub-pixel to the plane size of the second blue filter of the white sub-pixel is equal to 1.

4. The OLED display device according to claim 3, wherein, an arrangement of the second red filter, the second green filter and the second blue filter of the white sub-pixel is consistent with that of the red sub-pixel, the green sub-pixel and the blue sub-pixel.

5. The OLED display device according to claim 3, wherein, an interval of 0.1 um or above is provided between every two adjacent ones of the second red filter, the second green filter and the second blue filter of the white sub-pixel.

6. The OLED display device according to claim 2, wherein, an arrangement of the second red filter, the second green filter and the second blue filter of the white sub-pixel is consistent with that of the red sub-pixel, the green sub-pixel and the blue sub-pixel.

7. The OLED display device according to claim 2, wherein, an interval of 0.1 um or above is provided between every two adjacent ones of the second red filter, the second green filter and the second blue filter of the white sub-pixel.

8. The OLED display device according to claim 1, wherein, the second red filter, the second green filter and the second blue filter of the white sub-pixel are same in plane size.

9. The OLED display device according to claim 8, wherein, an arrangement of the second red filter, the second green filter and the second blue filter of the white sub-pixel is consistent with that of the red sub-pixel, the green sub-pixel and the blue sub-pixel.

10. The OLED display device according to claim 1, wherein, an arrangement of the second red filter, the second green filter and the second blue filter of the white sub-pixel is consistent with that of the red sub-pixel, the green sub-pixel and the blue sub-pixel.

11. The OLED display device according to claim 1, wherein, the second red filter, the second green filter and the second blue filter of the white sub-pixel are arranged in a linear manner or in a triangular manner.

12. The OLED display device according to claim 1, wherein, an interval of 0.1 um or above is provided between every two adjacent ones of the second red filter, the second green filter and the second blue filter of the white sub-pixel.

13. The OLED display device according to claim 1, wherein, an interval of 0.1 um or above is provided between every two adjacent ones of the first red filter, the first green filter and the first blue filter.

14. The OLED display device according to claim 1, wherein, the red sub-pixel, the green sub-pixel and the blue sub-pixel are defined by spacers.

15. The OLED display device according to claim 1, wherein, of the red sub-pixel, the green sub-pixel and the blue sub-pixel are different in plane size.

16. The OLED display device according to claim 1, wherein, a plane size of each of the second red filter, the second green filter and the second blue filter of the white sub-pixel is smaller than that of any one of the red sub-pixel, the green sub-pixel and the blue sub-pixel.

17. The OLED display device according to claim 1, wherein, the first OLED device, the second OLED device, the third OLED device and the fourth OLED device are all configured to be white light OLEDs emitting white light.

18. A repair method of an Organic Light-Emitting Diode (OLED) display device, wherein, the OLED display device comprises a pixel, wherein the pixel includes a red sub-pixel, a green sub-pixel, a blue sub-pixel and a white sub-pixel; the red sub-pixel includes a first OLED device and a first red filter located on a light outgoing side of the first OLED device; the green sub-pixel includes a second OLED device and a first green filter located on a light outgoing side of the second OLED device; the blue sub-pixel includes a third OLED device and a first blue filter located on a light outgoing side of the third OLED device; and the white sub-pixel includes a fourth OLED device and a second red filter, a second green filter and a second blue filter located on a light outgoing side of the fourth OLED device, the repair method comprising:

in a case that one of the red sub-pixel, the green sub-pixel and the blue sub-pixel has a bright spot defect, making the one of the red sub-pixel, the green sub-pixel and the blue sub-pixel fail to emit light in order to become a dark spot;

irradiating a region of the white sub-pixel except the light filter with a same color as that of the one of the red sub-pixel, the green sub-pixel and the blue sub-pixel to make an irradiated region of the fourth OLED device deteriorate and not emit light anymore; and when displaying, during gray scale converting from RGB into RGBW, a gray scale of the one sub-pixel is multiplied by a preset coefficient according to a size of the light filter of the white sub-pixel with the same color as that of the one of the red sub-pixel, the green sub-pixel and the blue sub-pixel, and then written into a gray scale of the white sub-pixel, and gray scales of the others of the red sub-pixel, the green sub-pixel and the blue sub-pixel being not converted.

19. The repair method of the OLED display device according to claim 18, wherein, a gray scale conversion formula is as follows:

$$x\hat{\ }gamma \times S1 = w\hat{\ }gamma \times S2$$

where, ˆ denotes power operation, x is a size of a gray scale in an original RGB signal corresponding to the one of the red sub-pixel, the green sub-pixel and the blue sub-pixel, w is a size of a gray scale in a converted RGBW signal corresponding to the white sub-pixel, S1 is a plane size of the one of the red sub-pixel, the green sub-pixel and the blue sub-pixel, S2 is a plane size of the light filter of the white sub-pixel with the same color as that of the one of the red sub-pixel, the green sub-pixel and the blue sub-pixel, and gamma is a relationship parameter of a gray scale and brightness of the display device and ranges from 2 to 2.4.

20. The repair method of the OLED display device according to claim 18, wherein, the irradiating the region of the white sub-pixel except the light filter with the same color as that of the one of the red sub-pixel, the green sub-pixel and the blue sub-pixel to make an irradiated region of the fourth OLED device deteriorate and not emit light any more is performed by using ultraviolet.

* * * * *

UNITED STATES PATENT AND TRADEMARK OFFICE
CERTIFICATE OF CORRECTION

PATENT NO. : 10,096,277 B2
APPLICATION NO. : 15/344142
DATED : October 9, 2018
INVENTOR(S) : Hsu Page 1 of 1

It is certified that error appears in the above-identified patent and that said Letters Patent is hereby corrected as shown below:

On the Title Page

Item (30) Foreign Application Priority Data, Column 1, Line 2:
Delete "2016 1 10046820" and insert --201610046820.3--

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*